(12) United States Patent
Kuo

(10) Patent No.: US 6,907,742 B2
(45) Date of Patent: Jun. 21, 2005

(54) APPARATUS AND METHOD FOR CONTROLLING WAFER TEMPERATURE

(75) Inventor: Yang-Kuao Kuo, Hsin-Chu (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 1 day.

(21) Appl. No.: 10/324,405

(22) Filed: Dec. 19, 2002

(65) Prior Publication Data

US 2004/0118130 A1 Jun. 24, 2004

(51) Int. Cl.[7] ............................................. F25D 25/00
(52) U.S. Cl. ............................ 62/62; 62/430; 62/434
(58) Field of Search ......................... 62/62, 259.2, 430, 62/434, 118, 304, 310; 165/80.4

(56) References Cited

U.S. PATENT DOCUMENTS

| | | | | |
|---|---|---|---|---|
| 4,361,749 A | * | 11/1982 | Lord | 219/121.4 |
| 5,088,006 A | * | 2/1992 | del Puerto et al. | 361/699 |
| 5,203,401 A | * | 4/1993 | Hamburgen et al. | 165/80.4 |
| 5,631,803 A | * | 5/1997 | Cameron et al. | 361/234 |
| 5,740,016 A | * | 4/1998 | Dhindsa | 361/704 |
| 5,901,037 A | * | 5/1999 | Hamilton et al. | 361/699 |
| 5,998,889 A | * | 12/1999 | Novak | 310/12 |
| 6,000,227 A | * | 12/1999 | Kroeker | 62/62 |
| 6,084,215 A | * | 7/2000 | Furuya et al. | 219/444.1 |
| 6,200,432 B1 | * | 3/2001 | Kobayashi et al. | 204/192.12 |
| 6,705,095 B2 | * | 3/2004 | Thompson et al. | 62/117 |

* cited by examiner

Primary Examiner—Denise L. Esquivel
Assistant Examiner—Richard L. Leung
(74) Attorney, Agent, or Firm—Tung & Associates

(57) ABSTRACT

An apparatus and method which is particularly suitable for maintaining a wafer at an optimum temperature for the alignment and exposure step during photolithography. The apparatus includes a cooling plate having at least one cooling channel. A coolant is continually circulated through the cooling channel to cool the cooling plate and the wafer resting thereon prior to transfer of the wafer to a wafer stage in a stepper, for example. The cooling plate may be mounted on an OF table inside the stepper and include a central opening for receiving the wafer-engaging shaft of the OF table. The cooling plate maintains all regions of the wafer at substantially the same temperature as the wafer stage in the stepper prior to transfer of the wafer to the wafer stage.

16 Claims, 2 Drawing Sheets

APPARATUS AND METHOD FOR CONTROLLING WAFER TEMPERATURE

FIELD OF THE INVENTION

The present invention relates to photolithography processes used in the formation of integrated circuit (IC) patterns on photoresist in the fabrication of semiconductor integrated circuits. More particularly, the present invention relates to an apparatus and method for controlling the temperature of a wafer prior to alignment and exposure of the wafer to light through a reticle in order to improve Nikon overlay and SMP (symmetrical multiprocessing) focus.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

Photoresist materials are coated onto the surface of a wafer by dispensing a photoresist fluid typically on the center of the wafer as the wafer rotates at high speeds within a stationary bowl or coater cup. The coater cup catches excess fluids and particles ejected from the rotating wafer during application of the photoresist. The photoresist fluid dispensed onto the center of the wafer is spread outwardly toward the edges of the wafer by surface tension generated by the centrifugal force of the rotating wafer. This facilitates uniform application of the liquid photoresist on the entire surface of the wafer.

The numerous processing steps outlined above are used to cumulatively apply multiple electrically conductive and insulative layers on the wafer and pattern the layers to form the circuits. The final yield of functional circuits on the wafer depends on proper application of each layer during the process steps. Proper application of those layers depends, in turn, on coating the material in a uniform spread over the surface of the wafer in an economical and efficient manner.

During the photolithography step of semiconductor production, light energy is applied through a reticle mask onto the photoresist material previously deposited on the wafer to define circuit patterns which will be etched in a subsequent processing step to define the circuits on the wafer. Because these circuit patterns on the photoresist represent a two-dimensional configuration of the circuit to be fabricated on the wafer, minimization of particle generation and uniform application of the photoresist material to the wafer are very important. By minimizing or eliminating particle generation during photoresist application, the resolution of the circuit patterns, as well as circuit pattern density, is increased.

A reticle is a transparent plate patterned with a circuit image to be formed in the photoresist coating on the wafer. A reticle contains the circuit pattern image for only a few of the die on a wafer, such as four die, for example, and thus, must be stepped and repeated across the entire surface of the wafer. In contrast, a photomask, or mask, includes the circuit pattern image for all of the die on a wafer and requires only one exposure to transfer the circuit pattern image for all of the dies to the wafer.

Spin coating of photoresist on wafers, as well as the other steps in the photolithography process, is carried out in an automated coater/developer track system using wafer handling equipment which transport the wafers between the various photolithography operation stations, such as vapor prime resist spin coat, develop, baking and chilling stations. Robotic handling of the wafers minimizes particle generation and wafer damage. Automated wafer tracks enable various processing operations to be carried out simultaneously. Two types of automated track systems widely used in the industry are the TEL (Tokyo Electron Limited) track and the SVG (Silicon Valley Group) track.

A typical method of forming a photoresist circuit pattern on a wafer includes introducing the wafer into the automated track system and then coating a photoresist layer onto the wafer. The photoresist is next cured by conducting a soft bake process. After it is cooled, the wafer is placed in an exposure apparatus, such as a stepper, which aligns the wafer with an array of die patterns etched on the typically chrome-coated quartz reticle. When properly aligned and focused, the stepper exposes a small area of the wafer, then shifts or "steps" to the next field and repeats the process until the entire wafer surface has been exposed to the die patterns on the reticle. After the aligning and exposing step, the wafer is exposed to post-exposure baking and then is developed, hard-baked to develop the photoresist pattern, and finally, removed from the track.

Throughout the photolithography process, the wafers are transported through a photolithography track that contains the various processing stations. A portion of a typical conventional photolithography track 10 is schematically shown in FIG. 1 and includes a track interface 12 which interfaces with a stepper 22. The track interface 12 contains a buffer cassette 14 that is loaded with photoresist-coated wafers 16 to be subsequently exposed in the stepper 22. A wafer transfer robot 18 transfers the wafers 16 from the buffer cassette 14 into the stepper 22. A wafer edge aligner (WEE) 20 is typically included in the track interface 12.

The stepper 22 contains a pre-alignment chamber 23 in which is provided an OF table 24. A wafer stage 32 is provided in the stepper 22, and a wafer transfer robot 30 is positioned between the OF table 24 and the wafer stage 32. In operation, the wafer transfer robot 18 in the track interface 12 places a wafer 28 onto a shaft 26 extended from the center of the OF table 24, after which the shaft 26 retracts and lowers the wafer 28 onto the OF table 24. The wafer 28 remains on the OF table 24 while a wafer 34 on the wafer stage 32 is aligned and exposed light through a reticle (not shown) in a stepped and repeated procedure for the formation of circuit patterns on the photoresist on the wafer 34. After the exposure procedure is completed and the wafer 34 is removed from the wafer stage 32 for further processing in a downstream processing station, the wafer transfer robot 30 transfers the wafer 28 from the OF table 24 to the wafer stage 32 for alignment and stepped exposure of the wafer 28 in similar fashion.

One of the problems inherent in the temporary storage of the wafers 16 in the buffer cassette 14 inside the track interface 12 is that the WEE 20 generates a substantial quantity of heat inside the track interface 12. This causes a rise in temperature inside the track interface 12 on the order of about 1–2 degrees Celsius. Typically, the temperature of the wafers 16 upon entry into the track interface 12 is about 23° C., and the wafers 16 may be warmed to a temperature of up to about 24–25° C. upon transfer to the OF table 24. While on the wafer stage 32, each wafer is maintained at a temperature of typically about 22.5° C. Accordingly, upon placement of each wafer on the wafer stage 32, the wafer may be several degrees warmer than the wafer stage 32. This disparity in temperatures causes a difference in temperatures between the core and the surface of the wafer, contributing to Nikon overlay and SMP (symmetrical multiprocessing) instability frequently leading to product failure. While an electric fan (not shown) typically provided in the track interface 12 is capable of reducing the interface temperature inside the track interface 12 somewhat, this reduction in temperature is inadequate for optimally maintaining the wafers 16 in the buffer cassette 14 at the same temperature as the wafer stage 32. Accordingly, an apparatus is needed for uniformly cooling and maintaining a wafer at substantially the same temperature as that of a wafer stage in a stepper before the wafer is transferred to the wafer stage. Such an apparatus would impart a substantially uniform temperature among all regions, particularly the core and surface regions, of the wafer and enhance Nikon overlay and SMP focus stability during alignment and exposure of the wafer through the reticle.

An object of the present invention is to provide an apparatus for maintaining a wafer at substantially the same temperature as a wafer stage in a stepper prior to transfer of the wafer to the wafer stage.

Another object of the present invention is to provide an apparatus and method which contributes to stability in Nikon overlay and SMP focus in the fabrication of semiconductor integrated circuits.

Still another object of the present invention is to provide an apparatus and method which facilitates uniform temperatures among all regions on a wafer prior to the exposure step in a photolithography process.

Yet another object of the present invention is to provide an apparatus and method which is suitable for reducing temperature gradients in a wafer during alignment of a wafer to an array of die patterns on a reticle and exposure of the wafer to light through the reticle in the formation of circuit patterns on the wafer.

Yet another object of the present invention is to provide an apparatus and method which facilitates optimum control of temperatures throughout a wafer.

A still further object of the present invention is to provide an apparatus for maintaining a wafer at an optimum temperature for a semiconductor fabrication process, which apparatus includes a cooling plate for receiving the wafer and maintaining the wafer at the optimum temperature.

SUMMARY OF THE INVENTION

In accordance with these and other objects and advantages, the present invention is generally directed to an apparatus and method which is particularly suitable for maintaining a wafer at an optimum temperature for the alignment and exposure step during photolithography. The apparatus includes a cooling plate having at least one cooling channel. A coolant is continually circulated through the cooling channel to cool the cooling plate and the wafer resting thereon prior to transfer of the wafer to a wafer stage in a stepper, for example. The cooling plate may be mounted on an OF table inside the stepper and include a central opening for receiving the wafer-engaging shaft of the OF table. The cooling plate maintains all regions of the wafer at substantially the same temperature as the wafer stage in the stepper prior to transfer of the wafer to the wafer stage. This enhances Nikon overlay and SMP focus stability.

BRIEF DESCRIPTION OF THE DRAWINGS

The invention will now be described, by way of example, with reference to the accompanying drawings, in which.

DESCRIPTION OF THE PREFERRED EMBODIMENTS

The present invention has particularly beneficial utility in cooling and maintaining a semiconductor wafer at a selected temperature prior to transfer of the wafer to a wafer stage in a photolithography stepper in order to promote uniform temperatures throughout the wafer during alignment and exposure of the wafer to light through a reticle. However, the invention is not so limited in application, and while references may be made to such wafer stage and photolithography stepper, the present invention is more generally applicable to cooling or maintaining wafers at a desired temperature at any point during the semiconductor fabrication process.

Figure 1:
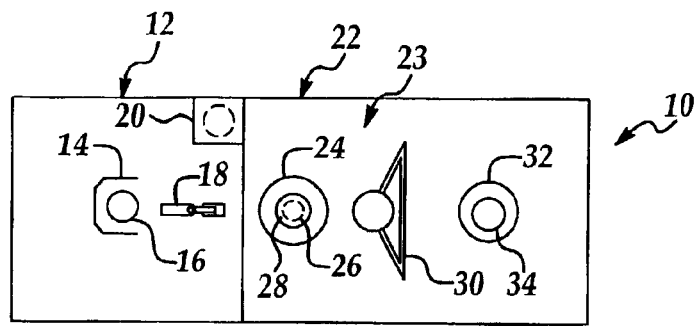
FIG. 1 is a schematic top view of a portion of a typical conventional photolithography track for the fabrication of semiconductor integrated circuits.
Figure 2:
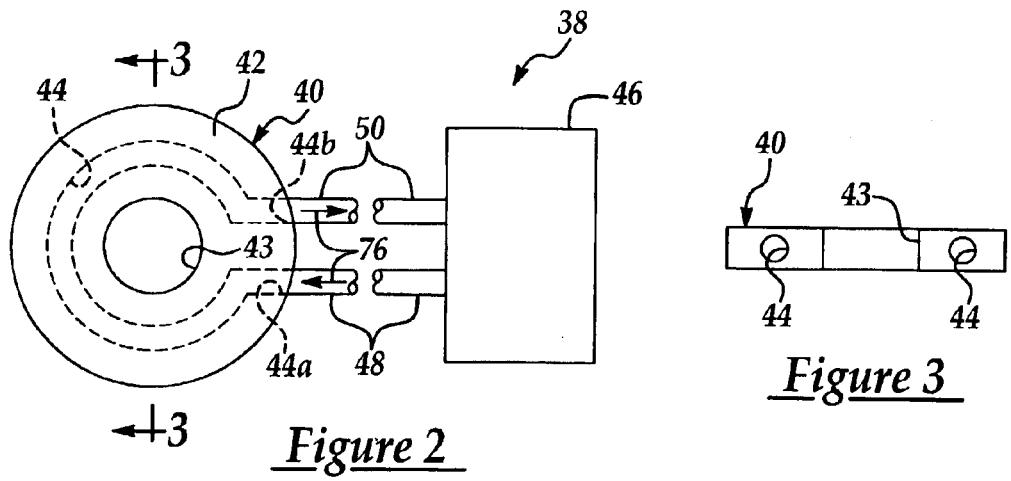
FIG. 2 is a top view, partially in section, of an apparatus of the present invention.
Figure 3:
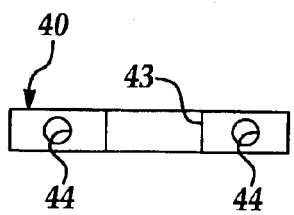
FIG. 3 is a cross-sectional view, taken along section lines 3—3 in FIG. 2.

Referring initially to FIGS. 2 and 3, an illustrative embodiment of the apparatus 38 of the present invention includes a cooling plate 40 having a thermally-conductive, typically metallic body 42. A central shaft opening 43 extends through the body 42 for purposes hereinafter described. At least one cooling channel 44 extends through the body 42 and encircles the shaft opening 43. While one cooling channel 44 is shown extending through the body 42 in FIGS. 2 and 3, it is understood that multiple cooling channels 44 may extend through the body 42 in any desired pattern, such as a spiral pattern, for example. A coolant pump and supply tank 46, which contains a supply of liquid coolant 76, is provided in fluid communication with an inlet end 44a of the cooling channel 44 through a coolant intake conduit 48 and with an outlet end 44b of the cooling channel 44 through a coolant outlet conduit 50. Accordingly, in application of the apparatus 38 as hereinafter described, the coolant pump and supply tank 46 is adapted for circulating the coolant 76 respectively through the coolant intake conduit 48, the cooling channel 44 and the coolant outlet conduit 50, which returns the coolant 76 to the coolant pump and supply tank 46. The coolant pump and supply tank 46 is also capable of maintaining the coolant 76 at a selected temperature, according to the knowledge of those skilled in the art.

Figure 4:
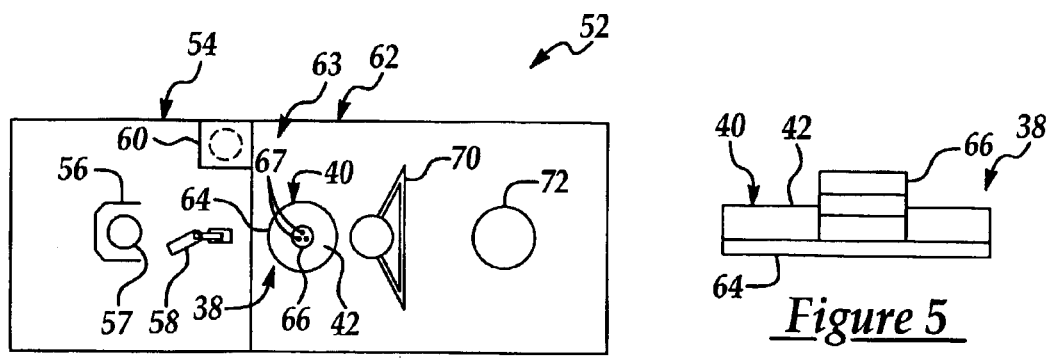
FIG. 4 is a top schematic view of a portion of a photolithography track incorporating the apparatus of the present invention.
Figure 5:
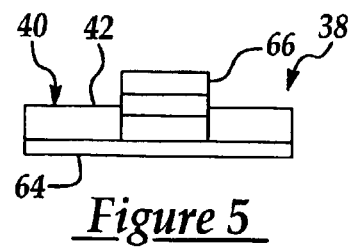
FIG. 5 is a side view of the cooling plate element of the apparatus of the present invention, shown mounted on a conventional OF table in a stepper.

Referring next to FIGS. 4 and 5, a portion of a photolithography track 52 which incorporates the apparatus 38 of the present invention includes a track interface 54 which interfaces with a stepper 62. The track interface 54 contains a buffer cassette 56 that is loaded with photoresist-coated wafers 57 to be subsequently aligned and exposed to light through a reticle (not shown) in the stepper 62. A wafer transfer robot 58 transfers the individual wafers 57 from the buffer cassette 56 into the stepper 62, as hereinafter described. A wafer edge aligner (WEE) 60 may be included in the track interface 54, in conventional fashion. The stepper 62 includes a pre-alignment chamber 63 which contains an OF table 64, as shown in FIG. 5. A wafer stage 72 is included in the stepper 62, and a wafer transfer robot 70 is positioned between the OF table 64 and the wafer stage 72. As shown in FIG. 5, a shaft 66 is telescopically extendible from the OF table 64 for receiving and engaging a wafer (not shown), and multiple wafer disengaging pins 67 are typically provided in the shaft 66 for disengaging the wafer from the shaft 66, in conventional fashion and as hereinafter described. As further shown in FIG. 5, the cooling plate 40 of the apparatus 38 rests on the OF table 64, with the telescoping shaft 66 extending upwardly through the central shaft opening 43 of the cooling plate 40.

Figure 6:
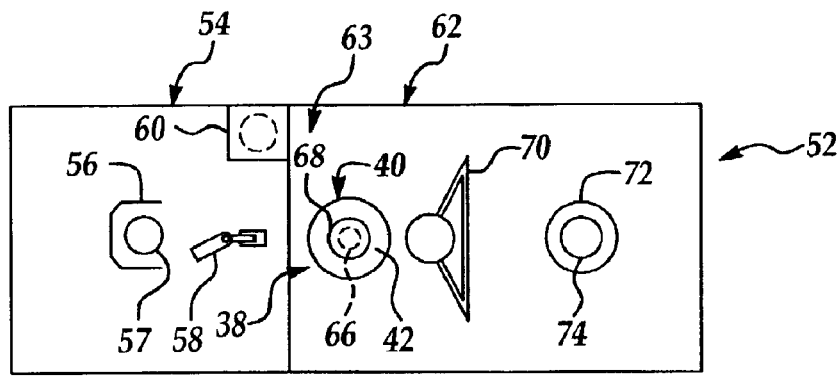
FIG. 6 is a top schematic view of a portion of a photolithography track in implementation of the present invention.
Figure 7A:
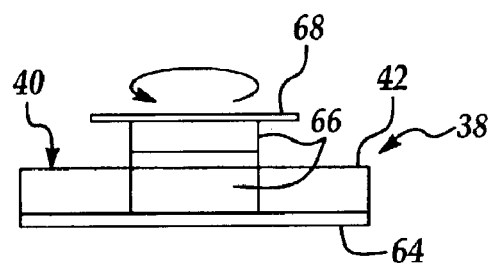
FIG. 7A is a side view of the cooling plate element of the apparatus of the present invention, mounted on a conventional OF table, with the shaft element of the OF table shown in the raised or extended position and engaging a wafer.
Figure 7B:
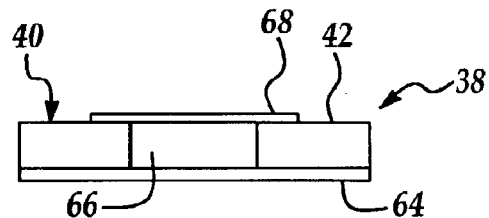
FIG. 7B is a side view of the cooling plate element of the apparatus of the present invention, mounted on a conventional OF table, with the shaft element of the OF table shown in the lowered or retracted position and the wafer resting on the cooling plate.
Figure 7C:
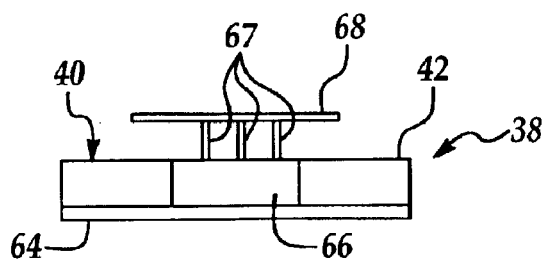
FIG. 7C is a side view of the cooling plate element of the apparatus of the present invention, mounted on a conventional OF table, with conventional wafer disengaging pins of the OF table shaft shown extended from the OF table shaft and lifting the wafer from the cooling plate preparatory to transfer of the wafer to a wafer stage in the stepper.

Referring next to FIGS. 6–7C, in operation of the apparatus 38, multiple wafers 57, having cured photoresist layered thereon and arriving from an upstream processing station in the photolithography track 54, are placed in the buffer cassette 56 inside the track interface 54. While they are stored in the buffer cassette 54 to await the alignment and exposure step carried out in the stepper 62, the wafers 57 are subjected to temperatures exceeding the temperature of the wafer stage 72 in the stepper 62, due largely to the presence of the WEE 60 in the track interface 54. Whereas the optimum temperature of the wafer stage 72 is typically about 22.5° C., the temperature of the wafers 57 in the buffer cassette 56 may rise as high as about 25° C. The wafers 57 must therefore be cooled or brought into thermal equilibrium with the wafer stage 72 prior to the alignment and exposure process carried out on the wafer stage 72. Accordingly, the wafer transfer robot 58 in the track interface 54 removes a wafer 68 from the buffer cassette 56 and places the wafer 68 onto the shaft 66 upwardly-extended from the OF table 64, as shown in FIG. 7A, at which point the shaft 66 rotates as indicated by the arrow to engage a notch (not shown) provided in the wafer 68, in conventional fashion. The shaft 66 is then telescopically retracted into the OF table 64, as shown in FIG. 7B, and thereby lowers the wafer 68 to rest on the body 42 of the cooling plate 40. Next, as the liquid coolant 76, maintained at the selected temperature, which is, in this case, 22.5° C. (the same temperature as that of the wafer stage 72), is continuously circulated from the coolant pump and supply tank 46 and through the coolant intake conduit 48, the cooling channel 44, the coolant outlet conduit 50, respectively, and back to the coolant pump and supply tank 46, as heretofore described with respect to FIG. 2. As the coolant 76 circulates through the cooling channel 44, heat from the wafer 68 is conducted by the cooling plate 42 and absorbed by the circulating coolant 76. This action cools the wafer 68 until a thermal equilibrium is reached between the wafer 68 and the cooling plate 40, at which point the wafer 68 has reached the temperature of the coolant 76 and cooling plate 40 (22.5° C. in this case). The wafer 68 remains on the cooling plate 40 while a wafer 74 on the wafer stage 72 is aligned and exposed to light through a reticle (not shown) in a stepped and repeated procedure for the formation of circuit patterns on the photoresist on the wafer 74, or for at least typically about 30 seconds.

After the exposure procedure is completed and the wafer 74 is removed from the wafer stage 72 for further processing in a downstream processing station (not shown), the wafer transfer robot 70 transfers the cooled wafer 68 from the coolant plate 40 to the wafer stage 72 for alignment and stepped exposure of the wafer 68 in similar fashion. This is typically accomplished as shown in FIG. 7C, by extension of the wafer disengaging pins 67 from the shaft 66 during rotation of the shaft 66 to disengage the shaft 66 from the notch (not shown) in the wafer 68, in conventional fashion. Simultaneously, the wafer transfer robot 70 engages and transfers the wafer 68 to the wafer stage 72. Accordingly, the temperature of the wafer 68 is substantially the same as the temperature of the wafer stage 72, and this enhances Nikon overlay and SMP focus stability during subsequent processing of the wafer 74. The remaining wafers 57 in the buffer cassette 56 are individually treated in the manner heretofore described with respect to the wafer 68 to impart thermal equilibrium between each wafer 57 and the wafer stage 72 prior to the alignment and exposure process.

While the preferred embodiments of the invention have been described above, it will be recognized and understood that various modifications can be made in the invention and the appended claims are intended to cover all such modifications which may fall within the spirit and scope of the invention.

What is claimed is:

1. An apparatus for controlling temperature of a wafer, comprising:
   a cooling plate having a body for receiving a wafer;
   at least one cooling channel provided in said body for circulating a coolant through said body; and
   a coolant pump and supply tank provided in fluid communication with said at least one cooling channel for containing the coolant and circulating the coolant through said at least one cooling channel, said body having a central opening extending therethrough and wherein said at least one cooling channel at least partially encircles said central opening; and wherein said at least one cooling channel comprises an inlet and an outlet adjacent to each other in an edge of said body.

2. The apparatus of claim 1 further comprising a coolant intake conduit disposed in fluid communication with said inlet and a coolant outlet conduit disposed in fluid communication with said outlet.

3. A method of controlling temperature of a wafer, comprising the steps of:

providing a cooling plate having a body and at least one cooling channel provided in said body, said body having a central opening extending through said body and wherein said at least one cooling channel at least encircles said central opening;

wherein said at least one cooling channel comprises an inlet and an outlet adjacent to each other in an edge of said body;

circulating a coolant having a selected temperature through said at least one cooling channel, substantially uni-directionally around said central opening; and imparting said selected temperature to the wafer by supporting the wafer on said body.

4. The method of claim 3 wherein said selected temperature is about 22.5° C.

5. The method of claim 3 wherein said supporting the wafer on said body comprises the step of supporting the wafer on said body for at least about 30 seconds.

6. The method of claim 5 wherein said selected temperature is about 22.5° C.

7. The method of claim 3 further comprising a coolant intake conduit disposed in fluid communication with said inlet and a coolant outlet conduit disposed in fluid communication with said outlet.

8. The method of claim 3 wherein said inlet and said outlet are disposed in adjacent, spaced-apart relationship to each other.

9. The method of claim 8 further comprising a coolant intake conduit disposed in fluid communication with said inlet and a coolant outlet conduit disposed in fluid communication with said outlet.

10. The method of claim 3 further comprising a coolant pump and supply tank provided in fluid communication with said at least one cooling channel for containing the coolant and circulating the coolant through said at least one cooling channel.

11. The method of claim 10 wherein said selected temperature is about 22.5° C.

12. The method of claim 10 where in said supporting the wafer on said body comprises the step of supporting the wafer on said body for at least about 30 seconds.

13. The method of claim 12 wherein said selected temperature is about 22.5° C.

14. A method of controlling temperature of a wafer in a pre-alignment chamber of a stepper, comprising the steps of:

providing a cooling plate in the pre-alignment chamber, said cooling plate having a body and at least one cooling channel provided in said body, said body having a central opening extending therethrough and wherein said at least one cooling channel encircles said central opening;

wherein said at least one cooling channel comprises an inlet and an outlet adjacent to each other in an edge of said body;

circulating a coolant having a selected temperature through said at least one cooling channel, substantially uni-directionally around said central opening; and imparting said selected temperature to the wafer by supporting the wafer on said body.

15. The method of claim 14 wherein said selected temperature is about 22.5° C.

16. The method of claim 14 wherein said supporting the wafer on said body comprises the step of supporting the wafer on said body for at least about 30 seconds.

* * * * *